United States Patent
Fujiwara (10) Patent No.: US 6,426,664 B1
(45) Date of Patent: Jul. 30, 2002

(54) SUPPRESSER CIRCUIT (75) Inventor: Takashi Fujiwara, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 82 days.

(21) Appl. No.: 09/629,873

(22) Filed: Aug. 1, 2000

(30) Foreign Application Priority Data

Aug. 2, 1999 (JP) .......................................... 11-218364

(51) Int. Cl.$^7$ ................................................ H03K 5/08
(52) U.S. Cl. ........................................ 327/309; 327/77
(58) Field of Search ............................... 327/77, 53, 66, 327/89, 560–563, 309, 327, 328; 330/288

(56) References Cited

U.S. PATENT DOCUMENTS

| | | | | |
|---|---|---|---|---|
| 4,339,674 A | * | 7/1982 | Hashimoto | .................... 327/77 |
| 5,696,457 A | * | 12/1997 | Rezzi et al. | ................... 327/66 |
| 6,181,169 B1 | * | 2/2001 | Hu | ............................... 327/77 |

FOREIGN PATENT DOCUMENTS

JP          6-261228        9/1994

* cited by examiner

Primary Examiner—Toan Tran
(74) Attorney, Agent, or Firm—Oblon, Spivak, McClelland, Maier & Neustadt, P.C.

(57) ABSTRACT

In a suppresser circuit, a first voltage-to-current converting circuit converts an input voltage signal to an output current signal. A second voltage-to-current converting circuit has a non-inverting input terminal for receiving a predetermined bias potential and an inverting input terminal for receiving the input voltage signal. A current-limiting element is connected between the first and second voltage-to-current converting circuits, for substantially stopping a flow of current between the first and second voltage-to-current converting circuits while the input voltage signal remains at a level equal to or lower than the bias potential, and for decreasing the output current of the first voltage-to-current converting circuit while the input voltage signal remains at a level higher than the bias potential.

20 Claims, 4 Drawing Sheets

SUPPRESSER CIRCUIT

CROSS-REFERENCE TO RELATED APPLICATIONS

This application is based upon and claims the benefit of priority from the prior Japanese Patent Application No. 11-218364, filed Aug. 2, 1999, the entire contents of which are incorporated herein by reference.

BACKGROUND OF THE INVENTION

The present invention relates to a suppresser which comprises MOS transistors, and more particularly to a suppresser fit for use in processing video signals in television receivers.

Hitherto, gamma correction has been widely performed to compress the white-level side component of a video signal in television receivers. In the image-receiving tube of a television receiver, the input drive voltage and the output electron-beam current generally have no linear input-output relation. Rather, the input drive voltage and the input electron-beam current has an exponential input-output relation, i.e., a non-linear input-output relation. Therefore, there exits the trend that the white-level side component of the video signal is amplified more than the black-side level component of the video signal. To compensate for the non-linear input-output relation, gamma correction is usually performed, suppressing the white-side level component of the video signal before the video signal is supplied to the image-receiving tube.

Figure 9:
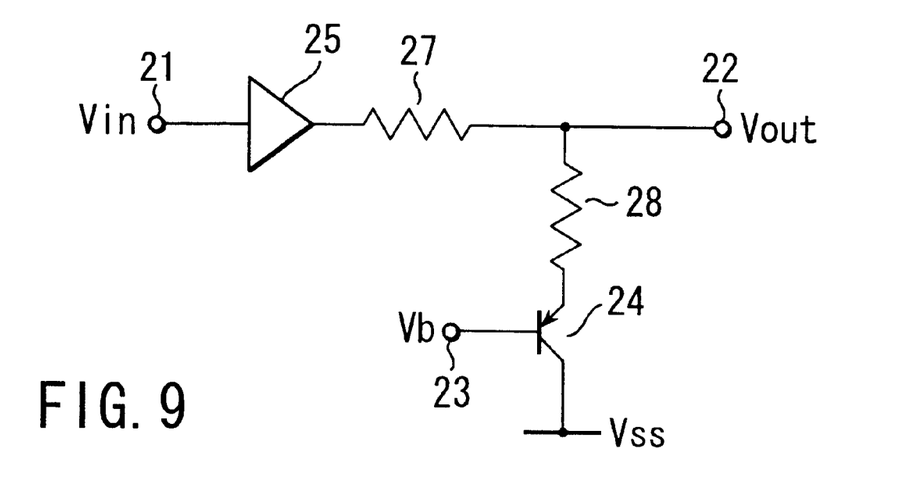
FIG. 9 is circuit diagram of a conventional suppresser, i.e., a circuit incorporating a bipolar transistor.
Figure 10:
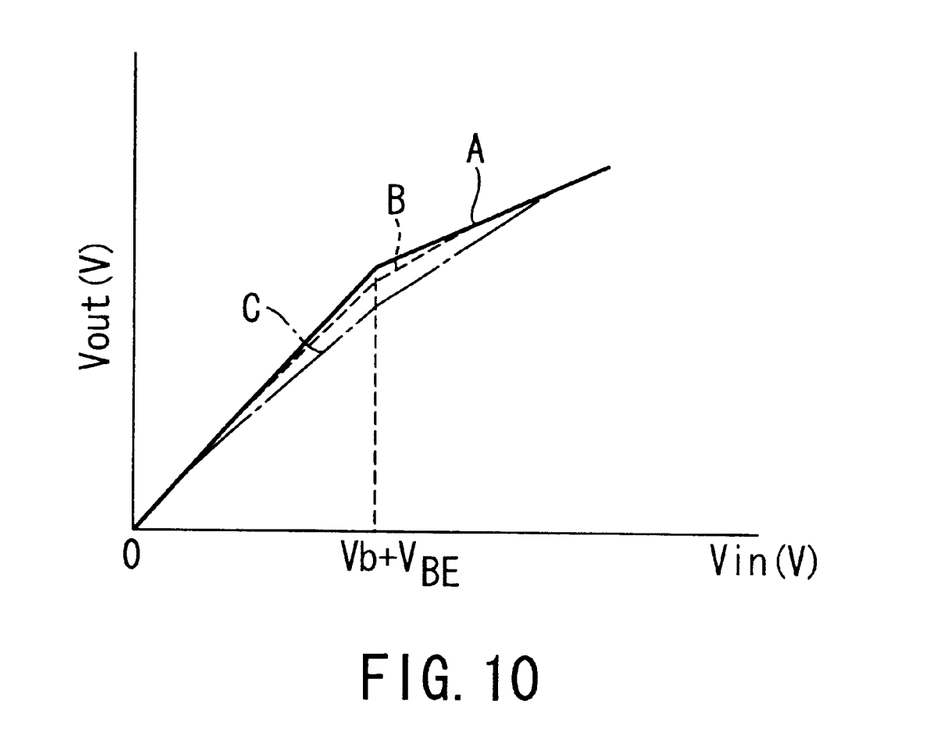
FIG. 10 is a graph illustrating the characteristic curve of the conventional suppresser shown in FIG. 9.

A suppresser is used to accomplish gamma correction. Most suppressers for use in the gamma correction comprise bipolar transistors, as disclosed in, for example, Jpn. Pat. Appln. KOKAI Publication No. 6-261228. FIG. 9 is a schematic diagram of a suppresser that comprises a bipolar transistor. FIG. 10 represents the input-output voltage characteristic of the suppresser.

The suppresser shown in FIG. 9 comprises an input terminal 21, an output terminal 22, a bias-potential input terminal 23, a PNP-type bipolar transistor 24, a buffer circuit 25 of voltage follower type, a resistor 27, and a resistor 28. The buffer circuit 25 has its input connected to the input terminal 21 and its output connected to the output terminal 22 by the resistor 27. The resistor 28 and the PNP-type bipolar transistor 24 are connected in series between the output terminal 22 and the ground potential Vss. The base of the bipolar transistor 24 is connected to the input terminal 23 of the bias potential Vb. The buffer circuit 25 converts the image signal input to the input terminal 21 into an impedance, which is applied to the output terminal 22 through the resistor 27.

In the suppresser, the bipolar transistor 24 is not conducting while the input signal remains at level Vin that is equal to or lower than the sum (Vb+VBE) of the bias potential Vb and the base-emitter voltage VBE of the bipolar transistor 24. Hence, the input signal has attains a gain of 0 dB. In other words, the signal is output from the terminal 22, neither amplified nor suppressed. When the level Vin of the input signal rises above Vb+VBE, the bipolar transistor 24 is turned on. The level Vout of the output signal is therefore suppressed as indicated by the solid line A shown in FIG. 10. The suppression level r is given as: R1/(Re+R1+R2), where R1 is the resistance of the resistor 27, R2 is the resistance of the resistor 28, and Re is the output impedance of the bipolar transistor 24. The solid line A shown in FIG. 10 bends at Vb+VBE, showing that the gain of the output signal is greater when the level Vin of the input signal lower than Vb+VBE than when the level Vin is higher than Vb+VBE. Actually, however, the gain gradually changes due to the output impedance of the bipolar transistor 24. Thus, the ratio of the output-signal level Vout of the input-signal level Vin changes as indicated by the broken curve B shown in FIG. 10, but not so much as indicated by the solid bending line A.

Recently, an attempt has been made everywhere to use MOS transistors in analog signal-processing circuits, not using bipolar transistors as has been practiced hitherto, in order lower the manufacturing cost of the analog signal-processing circuits. In this technological trend it is desired that suppressers be developed which comprise MOS transistors. The suppresser of FIG. 9, however, cannot have desired characteristics, merely by replacing the bipolar transistor 24 with a MOS transistor.

This is because MOS transistors have an output impedance much higher than that of bipolar transistors. Generally, the output impedance of a transistor differs from the design value due to errors in the manufacturing process and changes in the temperature of the transistor.

In the suppresser shown in FIG. 9, the output impedance Re of the bipolar transistor 24 is negligibly small, far less than the resistances R1 and R2 of resistors 27 and 28, which determine the suppression level r the circuit achieves. Thus, the suppression level r depends on almost only the resistances R1 and R2. An error, if any, in the output impedance Re of the bipolar transistor 24 does not influence the suppression level r so much.

By contrast, a MOS transistor has an output impedance Re which is comparable to the resistance R1 of the resistor 27 and the resistance R2 of the resistor 28. If the bipolar 24 is replaced by a MOS transistor, the output impedance Re of the MOS transistor will greatly influence the suppression level r the suppresser achieves. Consequently, the suppression level r will much change if the output impedance Re of the MOS transistor differs from the design value due to errors resulting from the manufacturing process variation or errors resulting from the temperature variation. The suppresser fails to have stable operating characteristics. Furthermore, since the MOS transistor has a much higher output impedance than the bipolar transistor 24, the ratio of the output-signal level Vout of the input-signal level Vin changes less as indicated by the one-dot dashed curve C in FIG. 10, than in the case where the bipolar transistor 24 is used. Inevitably, the operating characteristic of the suppresser cannot be sufficiently.

As mentioned above, it has been increasingly expected in recent years that analog signal-processing circuits be developed which comprising MOS transistors. However, a suppresser comprising a MOS transistor can hardly have stable operating characteristics because the MOS transistor has a high output impedance.

BRIEF SUMMARY OF THE INVENTION

The present invention has been made in consideration of the foregoing. The object of the invention is to provide a suppresser which comprises MOS transistors and which can yet exhibit stable operating characteristics, despite the fact that the output impedance of each MOS transistor differs from the design value due to errors in the manufacturing process and changes as the temperature of the transistor varies.

To attain the object, a suppresser circuit according to a first aspect of the present invention, comprises a first voltage-to-current converting circuit configured to convert an input voltage signal to an output current signal; a second voltage-to-current converting circuit having a non-inverting input terminal for receiving a predetermined bias potential and an inverting input terminal for receiving the input voltage signal; and a current-limiting element connected between the first and second voltage-to-current converting circuits, configured to substantially stop a flow of current between the first and second voltage-to-current converting circuits while the input voltage signal remains at a level equal to or lower than the bias potential, and decrease the output current of the first voltage-to-current converting circuit while the input voltage signal remains at a level higher than the bias potential.

In the suppresser circuit according to the first aspect of the present invention, the first voltage-to-current converting circuit may have a non-inverting input terminal supplied with the input voltage signal and an inverting input terminal connected to an output terminal.

In the suppresser circuit according to the first aspect of the present invention, the current-limiting element may comprise a PN-junction diode connected between the first and second voltage-to-current converting circuits.

In the suppresser circuit according to the first aspect of the present invention, the second voltage-to-current converting circuit may have transconductance smaller than that of the first voltage-to-current converting circuit.

In the suppresser circuit according to the first aspect of the present invention, the suppresser circuit may further comprise at least one additional voltage-to-current converting circuit having a non-inverting input terminal and an inverting input terminal and at least one additional current-limiting element, and in which a pair of the second voltage-to-current converting circuit and the current-limiting element, and a pair of the additional voltage-to-current converting circuit and the additional current-limiting element are connected in parallel to the first voltage-to-current converting circuit, and different bias potentials are applied to the non-inverting input terminals of the second voltage-to-current converting circuit and the additional voltage-to-current converting circuit.

A suppresser circuit according to a second aspect of the present invention, comprises an input terminal; an output terminal; a first potential-applied node; a second potential-applied node; a first differential circuit composed of first and second MOS transistors of a first conductivity type, the first MOS transistor having a gate connected to the input terminal, a source and a drain, and the second MOS transistor having a gate and a drain, both connected to the output terminal, and a source; a first current source connected at one end to the sources of the first and second MOS transistors and at the other end to the first potential-applied node; a first current mirror circuit composed of third and fourth MOS transistors of a second conductivity type, the third MOS transistor having a gate and a drain, both connected to the drain of the first MOS transistor, and a source connected to the second potential-applied node, and the fourth MOS transistor having a gate connected to the gate of the third MOS transistor, a drain connected to the drain of the second MOS transistor and a source connected to the second potential-applied node; a second differential circuit composed of fifth and sixth MOS transistors of the first conductivity type, the fifth MOS transistor having a source, a drain and a gate for receiving a predetermined bias potential, and the sixth MOS transistor having a source, a drain and a gate connected to the input terminal; a second current source connected at one end to the sources of the fifth and sixth MOS transistors and at the other end to the first potential-applied node; a second current mirror circuit composed of seventh and eighth MOS transistors of the second conductivity type, the seventh MOS transistor having a gate and a drain, both connected to the drain of the fifth MOS transistor, and a source connected to the second potential-applied node, and the eighth MOS transistor having a gate connected to the gate of the seventh MOS transistor, a drain connected to the drain of the sixth MOS transistor and a source connected to the second potential-applied node; and a third current mirror circuit composed of ninth and tenth MOS transistors of the second conductivity type, the ninth MOS transistor having a gate and a drain, both connected to the drain of the eighth MOS transistor, and a source connected to the second potential-applied node, and the tenth MOS transistor having a gate connected to the gate of the ninth MOS transistor, a drain connected to the drain of the third MOS transistor and a source connected to the second potential-applied node.

In the suppresser circuit according to the second aspect of the present invention, the first and second MOS transistors may have a channel width-to-length ratio W/L, and the fifth and sixth MOS transistors may have a channel width-to-length ratio W/L different from that of the first and second MOS transistors.

In the suppresser circuit according to the second aspect of the present invention, the first and second current sources may supply currents of different values.

In the suppresser circuit according to the second aspect of the present invention, the ninth and tenth MOS transistors may have different channel width-to-length ratios W/L.

In the suppresser circuit according to the second aspect of the present invention, the suppresser circuit may further comprise a third differential circuit composed of eleventh and twelfth MOS transistors of the first conductivity type, the eleventh MOS transistor having a source, a drain and a gate for receiving a bias potential different to the bias potential applied to the gate of the fifth MOS transistor, and the twelfth MOS transistor having a source, a drain and a gate connected to the input terminal; a third current source connected at one end to the sources of the eleventh and twelfth MOS transistors, and at the other end to the first potential-applied node; a fourth current mirror circuit composed of thirteenth and fourteenth MOS transistors of the second conductivity type, the thirteenth MOS transistor having a gate and a drain, both connected to the drain of the eleventh MOS transistor, and a source connected to the second potential-applied node, and the fourteenth MOS transistor having a gate connected to the gate of the thirteenth MOS transistor, a drain connected to the drain of the twelfth MOS transistor and a source connected to the second potential-applied node; and a fifth current mirror circuit composed of fifteenth and sixteenth MOS transistors of the second conductivity type, the fifteenth MOS transistor having a gate and a drain, both connected to the drain of the fourteenth MOS transistor, and a source connected to the second potential-applied node, and the sixteenth MOS transistor having a gate connected to the gate of the fifteenth MOS transistor, a drain connected to the drain of the third MOS transistor and a source connected to the second potential-applied node.

A video signal processing circuit according to a third aspect of the present invention, comprises a first signal processing circuit configured to receive a chromatic signal of a video signal, and process the chromatic signal to generate a color-difference signal; a second signal processing circuit configured to receive a luminance signal of the video signal, and process the luminance signal to suppress a white-level component thereof; and a metric circuit configured to receive output signals of the first and second signal processing circuits, and compose thereof, the second signal processing circuit including a first voltage-to-current converting circuit configured to convert an input voltage signal to an output current signal; a second voltage-to-current converting circuit having a non-inverting input terminal for receiving a predetermined bias potential and an inverting input terminal for receiving the input voltage signal; and a current-limiting element connected between the first and second voltage-to-current converting circuits, configured to substantially stop a flow of current between the first and second voltage-to-current converting circuits while the input voltage signal remains at a level equal to or lower than the bias potential, and decrease the output current of the first voltage-to-current converting circuit while the input voltage signal remains at a level higher than the bias potential.

In the suppresser circuit according to the third aspect of the present invention, the first voltage-to-current converting circuit may have a non-inverting input terminal supplied with the input voltage signal and an inverting input terminal connected to an output terminal.

In the suppresser circuit according to the third aspect of the present invention, the current-limiting element may comprise a PN-junction diode connected between the first and second voltage-to-current converting circuits.

In the suppresser circuit according to the third aspect of the present invention, the second voltage-to-current converting circuit may have transconductance smaller than that of the first voltage-to-current converting circuit.

In the suppresser circuit according to the third aspect of the present invention, the suppresser circuit may further comprise at least one additional voltage-to-current converting circuit having a non-inverting input terminal and an inverting input terminal and at least one additional current-limiting element, and in which a pair of the second voltage-to-current converting circuit and the current-limiting element, and a pair of the additional voltage-to-current converting circuit and the additional current-limiting element are connected in parallel to the first voltage-to-current converting circuit, and different bias potentials are applied to the non-inverting input terminals of the second voltage-to-current converting circuit and the additional voltage-to-current converting circuit.

In the suppresser circuit according to the third aspect of the present invention, the first voltage-to-current converting circuit may include a first differential circuit composed of first and second MOS transistors of a first conductivity type, the first MOS transistor having a gate connected to an input terminal, a source and a drain, and the second MOS transistor having a gate and a drain, both connected to an output terminal, and a source; a first current source connected at one end to the sources of the first and second MOS transistors and at the other end to a first potential-applied node; and a first current mirror circuit composed of third and fourth MOS transistors of a second conductivity type, the third MOS transistor having a gate and a drain, both connected to the drain of the first MOS transistor, and a source connected to a second potential-applied node, and the fourth MOS transistor having a gate connected to the gate of the third MOS transistor, a drain connected to the drain of the second MOS transistor and a source connected to the second potential-applied node, the second voltage-to-current converting circuit may include a second differential circuit composed of fifth and sixth MOS transistors of the first conductivity type, the fifth MOS transistor having a source, a drain and a gate for receiving a predetermined bias potential, and the sixth MOS transistor having a source, a drain and a gate connected to the input terminal; a second current source connected at one end to the sources of the fifth and sixth MOS transistors and at the other end to the first potential-applied node; and a second current mirror circuit composed of seventh and eighth MOS transistors of the second conductivity type, the seventh MOS transistor having a gate and a drain, both connected to the drain of the fifth MOS transistor, and a source connected to the second potential-applied node, and the eighth MOS transistor having a gate connected to the gate of the seventh MOS transistor, a drain connected to the drain of the sixth MOS transistor and a source connected to the second potential-applied node, and the current-limiting element may include a third current mirror circuit composed of ninth and tenth MOS transistors of the second conductivity type, the ninth MOS transistor having a gate and a drain, both connected to the drain of the eighth MOS transistor, and a source connected to the second potential-applied node, and the tenth MOS transistor having a gate connected to the gate of the ninth MOS transistor, a drain connected to the drain of the third MOS transistor and a source connected to the second potential-applied node. The first and second MOS transistors may have a channel width-to-length ratio W/L, and the fifth and sixth MOS transistors may have a channel width-to-length ratio W/L different from that of the first and second MOS transistors. The first and second current sources may supply currents of different values. The ninth and tenth MOS transistors may have different channel width-to-length ratios W/L. The suppresser circuit may further comprise a third differential circuit composed of eleventh and twelfth MOS transistors of the first conductivity type, the eleventh MOS transistor having a source, a drain and a gate for receiving a bias potential different than the bias potential applied to the gate of the fifth MOS transistor, and the twelfth MOS transistor having a source, a drain and a gate connected to the input terminal; a third current source connected at one end to the sources of the eleventh and twelfth MOS transistors, and at the other end to the first potential-applied node; a fourth current mirror circuit composed of thirteenth and fourteenth MOS transistors of the second conductivity type, the thirteenth MOS transistor having a gate and a drain, both connected to the drain of the eleventh MOS transistor, and a source connected to the second potential-applied node, and the fourteenth MOS transistor having a gate connected to the gate of the thirteenth MOS transistor, a drain connected to the drain of the twelfth MOS transistor and a source connected to the second potential-applied node; and a fifth current mirror circuit composed of fifteenth and sixteenth MOS transistors of the second conductivity type, the fifteenth MOS transistor having a gate and a drain, both connected to the drain of the fourteenth MOS transistor, and a source connected to the second potential-applied node, and the sixteenth MOS transistor having a gate connected to the gate of the fifteenth MOS transistor, a drain connected to the drain of the third MOS transistor and a source connected to the second potential-applied node.

The suppression level of the suppresser circuit is determined from the ratio between the transconductance of the first voltage-to-current converting circuit composed of the first differential circuit, first current source and first current mirror circuit and the transconductance of the second voltage-to-current converting circuit composed of the second differential circuit, second current source and first current mirror circuit. Therefore, the first and second voltage-to-current converting circuits cooperate to compensate for the changes in the characteristics of the suppresser circuit, which result from the temperature changes of each transistor and the deviation of the output impedance of each MOS transistor form its design value, due to errors in the manufacturing process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described in detail, with reference to the accompanying drawings.

Figure 1:
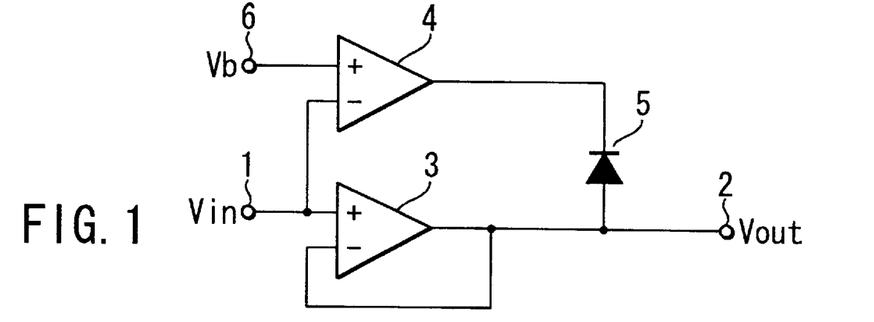
FIG. 1 is a diagram showing a suppresser that is the first embodiment of the invention.

FIG. 1 is a circuit diagram of a suppresser, which is the first embodiment of the invention. The suppresser has a signal input terminal 1, a signal output terminal 2, a first voltage-to-current converting circuit 3, a second voltage-to-current converting circuit 4, and a current-limiting element 5. The signal input terminal 1 (i.e., the input terminal of the suppresser) is connected to the non-inverting input terminal (+) of the first voltage-to-current converting circuit 3. The signal output terminal 2 (i.e., the output terminal of the suppresser) is connected to the output terminal of the first voltage-to-current converting circuit 3. The inverting input terminal (−) of the first voltage-to-current converting circuit 3 is connected to the output signal terminal 2. The second voltage-to-current converting circuit 4 and the current-limiting element 5, e.g., a PN-junction diode, are connected in series between the signal output terminal 2 and the non-inverting input terminal (+) of the first voltage-to-current converting circuit 3. The non-inverting input terminal (+) of the second voltage-to-current converting circuit 4 is connected to an input terminal 6 to which a prescribed bias potential Vb is applied. The inverting input terminal (−) of the second voltage-to-current converting circuit 4 is connected to the non-inverting input terminal (+) of the first voltage-to-current converting circuit 3. The current-limiting element 5 is connected between the first and second voltage-to-current converting circuits 3 and 4.

In the suppresser, i.e., the first embodiment of the invention, the second voltage-to-current converting circuit 4 compares the level Vin of the signal input to its inverting input terminal (−) with the bias potential Vb applied to its non-inverting input terminal (+). If the input signal level Vin is higher than the bias potential Vb, the output current of the first voltage-to-current converting circuit 3 is output to the output terminal of the second voltage-to-current converting circuit 4 through the current-limiting element 5. If the input signal level Vin is equal to or lower than the bias potential Vb, the current-limiting element 5 stops the supply of a current from the output terminal of the second voltage-to-current converting circuit 4 to the output terminal of the first voltage-to-current converting circuit 3. Therefore, the first voltage-to-current converting circuit 3 can be regarded as a buffer circuit having a gain of 0 dB as long as the input signal level Vin remains equal to or lower than the bias potential Vb. While the input signal level Vin remains equal to or lower than the bias potential Vb, the signal input to the input terminal 1 is output to the output terminal 2, neither amplified nor suppressed.

That is, the gain is of the suppresser is 0 dB if Vin>Vb, where Vin is the level of the input signal and Vb is the bias potential applied to the non-inverting input terminal (+) of the second voltage-to-current converting circuit 4. In this case, Vout=Vin, where Vout is the level of the signal output from the suppresser (FIG. 1). If Vin≦Vb, the following equation will hold:

$$-V\text{in}\cdot gm2+(V\text{in}-V\text{out})\cdot gm1=0$$

where gm1 is the transconductance of the first voltage-to-current converting circuit 3 and gm2 is voltage-to-current converting circuit 4.

From the above equation, the gain is given as follows:

$$V\text{out}/V\text{in}=1-gm2/gm1$$

Figure 2:
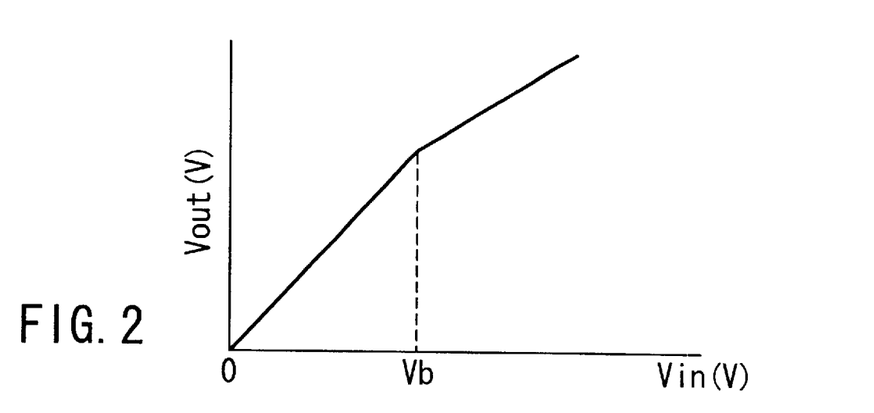
FIG. 2 is a graph illustrating the characteristic curve of the first embodiment.

FIG. 2 shows the characteristic line of the suppresser which is the first embodiment of the invention. As FIG. 22 shows, the gain sharply changes as the input signal level Vin rises or falls to the bias potential Vb. In other words, the characteristic line bends at the input signal level of Vb. While the input signal level Vin remains higher than the bias potential Vb (Vin>Vb), the suppression level r is equal to gm2/gm1, that is, r=gm2/gm1. The errors made in the process of manufacturing the MOS transistors and the errors resulting from the temperature changes are canceled. The suppresser can therefore exhibit stable operating characteristics which are similar to the design characteristics.

Figure 3:
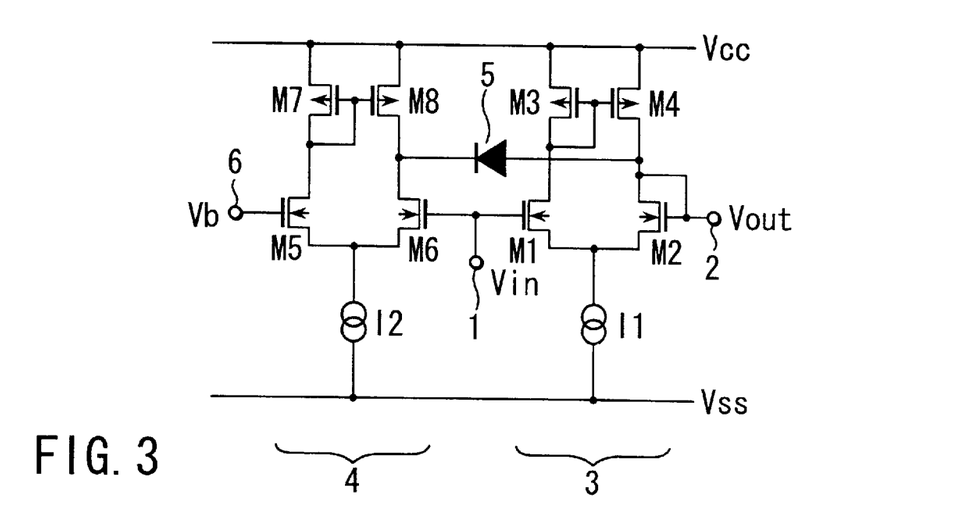
FIG. 3 is a detailed circuit diagram of the first embodiment, showing the components thereof.

The suppresser shown in FIG. 1 will be described in detail, with reference to FIG. 3 which is a detailed circuit diagram of the circuit. As FIG. 3 shows, the first voltage-to-current converting circuit 3 comprises a first differential circuit and a first current mirror circuit. The first differential circuit is composed of two N-channel MOS (NMOS) transistors M1 and M2. The first current mirror circuit is composed of a first current source I1 and two P-channel MOS (PMOS) transistors M3 and M4. As shown in FIG. 3, too, the second first voltage-to-current converting circuit 4 comprises a second differential circuit and a second current mirror circuit. The second differential circuit is composed of two N-channel MOS (NMOS) transistors M5 and M6. The second current mirror circuit is composed of a second current source I2 and two P-channel MOS (PMOS) transistors M7 and M8.

In the first voltage-to-current converting circuit 3, the gate of the NMOS transistor M1 incorporated in the first differential circuit is connected to the input terminal 1, and the gate and drain of the NMOS transistor M2 are connected to the output terminal 2. The first current source I1 is connected, at one end, to the source of the NMOS transistor M1 and the source of the NMOS transistor M2. The other end of the first current source I1 is connected to the ground potential Vss. The gate and drain of the PMOS transistor M3 incorporated in the first mirror current circuit are connected to the drain of the NMOS transistor M1. The source of the PMOS transistor M3 is connected to the power-supply potential Vcc. The PMOS transistor M4 has its gate connected to the gate of the PMOS transistor M3, its drain connected to the drain of the PMOS transistor M3, and its source connected to the power-supply potential Vcc.

In the second voltage-to-current converting circuit 4, the gate of the NMOS transistor M5 incorporated in the second differential circuit is connected to the input terminal 6 to which the bias potential Vb is applied. The gate of the NMOS transistor M6 is connected to the input terminal 1. The second current source I2 is connected at one end to the sources of the NMOS transistors M5 and M6 and at the other end to the ground potential Vss. The gate and drain of the PMOS transistor M7 provided in the second current mirror circuit are connected to the drain of the NMOS transistor M5. The source of the PMOS transistor M7 is connected to the power-supply potential Vcc. The PMOS transistor M8 has its gate connected to the gate of the PMOS transistor M7, its drain connected to the drain of the NMOS transistor M6, and its source connected to the power-supply potential Vcc.

In the suppresser of FIG. 3, the gate of the MMOS transistor M1, the gate of the NMOS transistor M2 and the drain of the NMOS transistor M2 are equivalent to the non-inverting input terminal (+), inverting input terminal (−) and output terminal of the first voltage-to-current converting circuit 3, respectively. The gate of the NMOS transistor M5, the gate of the NMOS transistor M6 and the drain of the NMOS transistor M6 are equivalent to the non-inverting input terminal (+), inverting input terminal (−) and output terminal of the second voltage-to-current converting circuit 4, respectively. The PN-junction diode constituting the current-limiting element 5 is provided between the drains of the NMOS transistors M2 and M6 and connected thereto.

In the suppresser, the inclination of the characteristic line shown in FIG. 2 is 0 or of a negative value if Vout/Vin(= 1−gm2/gm1)≦0. In this case, the suppresser has such characteristics that it cannot be used in a gamma correction system for processing video signals in a television receiver. In view of this, it is necessary for the transconductances gm1 and gm2 of the voltage-to-current converting circuits 3 and 4 to satisfy the following equation:

$$gm2/gm1(=r)<1$$

Assume that the MOS transistors constituting any pair in the first and second differential circuits have the same size. Then, the transconductances gm1 and gm2 can be represented as follows:

$$gm1=2\sqrt{(k1 \cdot i1/2)}$$
$$gm2=2\sqrt{(k2 \cdot i2/2)}$$
$$k1=(\mu 0 \cdot C0/2) \cdot (W1/L1)$$
$$k2=(\mu 0 \cdot C0/2) \cdot (W2/L2)$$

where k1 is a k constant common to the NMOS transistors M1 and M2 constituting the first differential circuit, k2 is a k constant common to the NMOS transistors M5 and M6 constituting the second differential circuit, i1 is the current supplied from the current source I1, i2 is the current supplied from the current source I1, $\mu 0$ is the mobility of electrons, C0 is the capacitance of the gate oxide film of the NMOS transistors M1, M2,, M5 and M6, W1 and L1 are, respectively, the channel width and length of the NMOS transistors M1 and M2, and W2 and L2 are, respectively, the channel width and length of the NMOS transistors M5 and M6.

The ratio of the transconductance of the second voltage-to-current converting circuit 4 to the transconductance of the first voltage-to-current converting circuit 3, i.e., gm2/gm1, can be set to less than 1 (gm2/gm1<1), if the ratio of the k constant common to the transistors M1 and M2 to the k constant common to the transistors M5 and M6, i.e., k1/k2, is set at a prescribed value and if the ratio of the current i1 from the first current source I1 to the current i2 from the second current source I2, i.e., i1/i2, is set at a prescribed value. More specifically, to render the ratio gm2/gm1 less than 1, the ratio W1/L1 of the NMOS transistors M1 and M2 may be made greater than ratio W2/L2 of the NMOS transistors M5 and M6, that is, W1/L1>W2/L2, or the current i1 from the first current source I1 may be made greater than the current i2 from the second current source I2, that is, i1>i2. Alternatively, both measures may be taken to render the ratio gm2/gm1 less than 1. In addition, if the parameters described above are appropriately adjusted, the suppression level r (=gm2/gm1) attained while Vin remains higher than Vb (Vin>Vb) can be optimized, not exceeding 1 (gm2/gm1<1). Thus, the suppresser can acquire desired characteristics.

Figure 4:
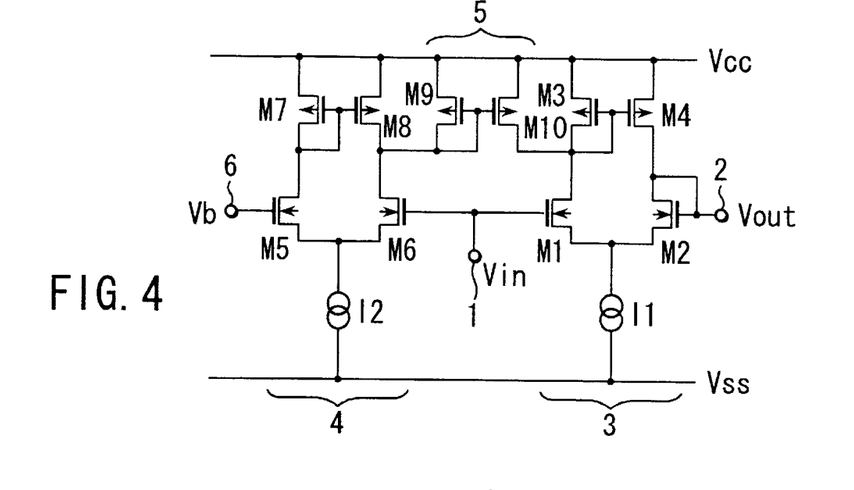
FIG. 4 is a more detailed circuit diagram of the first embodiment.

FIG. 4 is a circuit diagram of the suppresser, which is more detailed than FIG. 3. As seen from FIG. 4, the first voltage-to-current converting circuit 3 and the second voltage-to-current converting circuit 4 are identical to those illustrated in FIG. 3. A third current mirror circuit is used in place of the PN-junction diode which functions as the current-limiting element 5. As FIG. 4 shows, the third current mirror circuit comprises two P-channel MOS (PMOS) transistors M9 and M10.

In the third current mirror circuit, the gate and drain of the PMOS transistor M9 are connected to the drain of the PMOS transistor M8. The source of the PMOS transistor M9 is connected to the power-supply potential Vcc. The PMOS transistor M10 has its gate connected to the gate of the PMOS transistor M9, its drain connected to the drain of the PMOS transistor M3 and its source connected to the power-supply potential Vcc.

In the suppresser of FIG. 4, the third current mirror circuit comprising the PMOS transistors M9 and M10 holds back the output current of the second voltage-to-current converting circuit 4 if the input-signal level Vin is higher than the bias potential Vb, that is, if Vin>Vb. The output voltage of the second voltage-to-current converting circuit 4, thus adjusted, is added to the output current of the PMOS transistor M3 of the first current mirror circuit, in the drain of the NMOS transistor M1 of the first voltage-to-current converting circuit 3. The first and second voltage-to-current converting circuits 3 and 4 satisfy the following equations:

$$Ic = Vin \cdot gm2$$

$$n \cdot Ic = (Vin - Vout) \cdot gm1$$

where Ic is the output current of the second voltage-to-current converting circuit 4, and n is the mirror ratio of the third current mirror circuit.

The gain of the suppresser derives from these equations, as follows:

$$Vout/Vout = 1 - n \cdot gm1$$

If Vin≧Vb, no currents flow in the third current mirror circuit that comprises the PMOS transistors M9 and M10. In this case, the suppresser has a gain of 0 dB as in the suppresser of FIG. 3.

The suppress ion level r is n·gm2/gm1 (r=n·gm2/gm1) while Vin remains higher than Vb (Vin>Vb). Hence, the errors resulting from the process variation of manufacturing the MOS transistors and the errors resulting from the temperature changes are canceled. The suppresser can therefore exhibit stable operating characteristics which are similar to the design characteristics. As mentioned in conjunction with the suppresser of FIG. 3, it is desired that gm2/gm1(=r)<1 in the suppresser of FIG. 4, too. In the suppresser of FIG. 4, gm2/gm1 can be less than 1 only if the ratio of the k constant of the transistors M1 and M2 to the k constant of the transistors M5 and M6 is set at a prescribed value, and if the ratio of the current from the first current source I1 to the current from the second current source I2 is set at a prescribed value. Alternatively, parameters including the mirror ratio n of the third current mirror circuit may be controlled to less than 1 (n<1) in order to make n·gm2/gm1 less than 1.

To render the mirror ratio n of the third current mirror circuit to less than 1 (n<1), it only needs to set the following condition in the third current mirror circuit:

$$W9/L9 > W10/L10$$

where W9 and L9 are, respectively, the channel width and channel length of the PMOS transistor M9, and W10 and L10 are, respectively, the channel width and channel length of the PMOS transistor M10.

Moreover, the parameters, including the mirror ratio n of the third current mirror circuit, may be appropriately adjusted, as is the suppresser shown in FIG. 3. If this is the case, the suppression level r (=gm2/gm1) attained while Vin remains higher than Vb (Vin>Vb) can be optimized, not exceeding 1 (n·gm2/gm1 <1). As a result, the suppresser can acquire desired characteristics.

Figure 5:
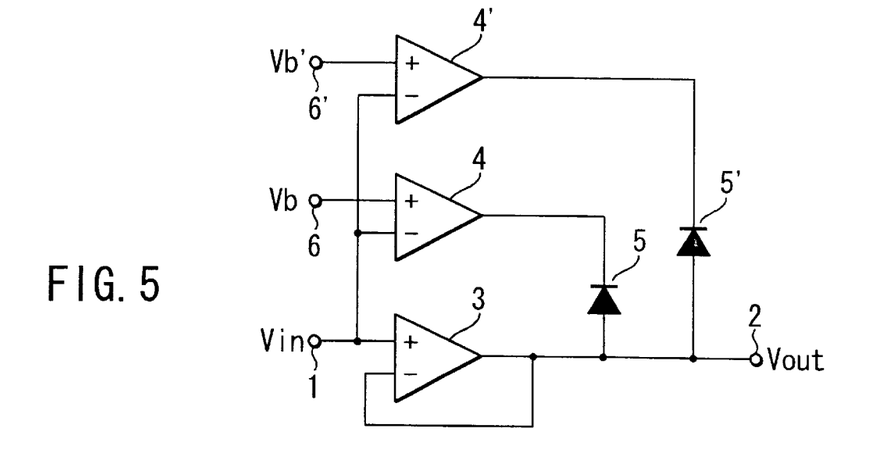
FIG. 5 is a circuit diagram showing a suppresser that is the second embodiment of the invention.

A suppresser that is the second embodiment of the invention will be described with reference to FIG. 5. In FIG. 5, the components identical to those shown in FIG. 1 are designated at the same reference numerals and will not be described in detail.

In the second embodiment, a series circuit of a voltage-to-current converting circuit 4' and a current-limiting element 5' is connected between the non-inverting input terminal (+) and output terminal of the first voltage-to-current converting circuit 3, in parallel to the series circuit that is composed of the second voltage-to-current converting circuit 4 and the current-limiting element 5. The second embodiment differs in this respect from the first embodiment. The voltage-to-current converting circuit 4' and the current-limiting element 5' are connected in almost the same way as the second voltage-to-current converting circuit 4 and the current-limiting element 5. More precisely, the inverting input terminal (−) of the voltage-to-current converting circuit 4' is connected to the non-inverting input terminal (−) of the first voltage-to-current converting circuit 3, together with the inverting input terminal (−) of the second voltage-to-current converting circuit 4. The output terminal of the voltage-to-current converting circuit 4' is connected by the current-limiting element 5' to the output terminal of the first voltage-to-current converting circuit 3.

Figure 6:
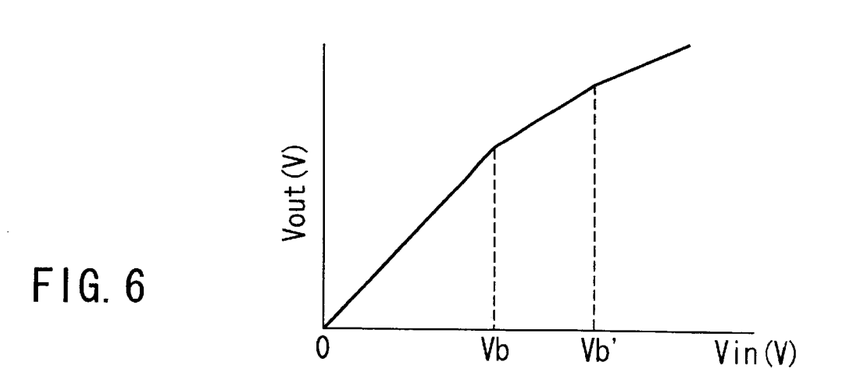
FIG. 6 is a graph representing the characteristic curve of the second embodiment.

FIG. 6 represents the characteristic curve of the second embodiment shown in FIG. 5. As FIG. 6 shows, the gain of this suppresser sharply changes when the level Vin of the input signal is Vb and when the level Vin is Vb'. The gain the second embodiment has when the level Vin is higher than Vb' (Vin>Vb') is given as follows:

$$Vout/Vin = 1 - gm2/gm1 - gm2'/gm1$$

where gm2' is the transconductance of the second voltage-to-current converting circuit 4'.

In this case, the suppression level r is (gm2+gm2')/gm1. The sizes of the transistors of the voltage-to-current converting circuits 4 and 4' and the currents are set to satisfy the relation of (gm2+gm2')/gm1<1. The two bias potentials Vb and Vb' may have the relation of either Vb>Vb' or Vb<Vb'.

Figure 7:
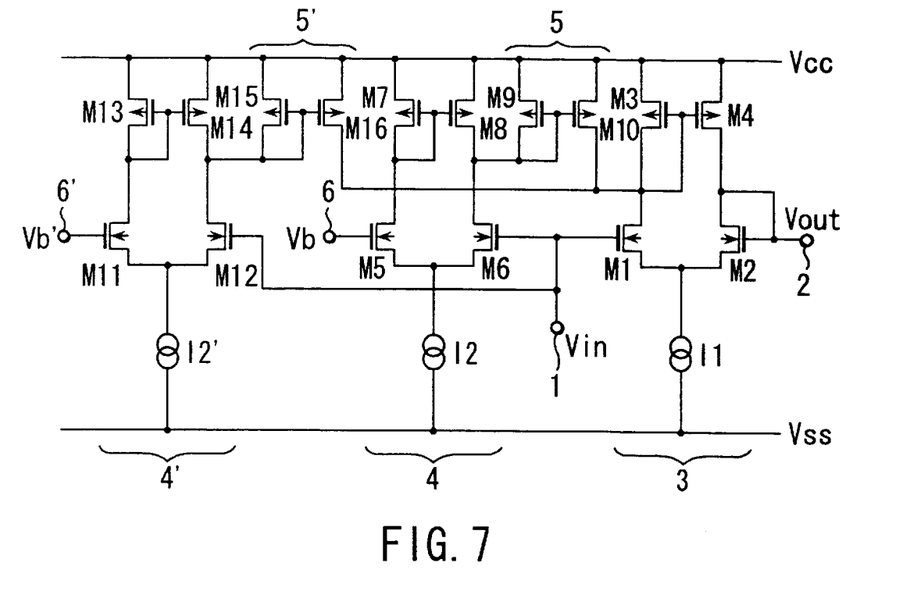
FIG. 7 is a detailed circuit diagram of the second embodiment, showing the components thereof.

FIG. 7 is a detailed circuit diagram of the suppresser of FIG. 5, showing the elements that constitute the suppresser. As shown in FIG. 7, each of the voltage-to-current converting circuits 3, 4 and 4' comprises a differential circuit composed of two N-channel MOS (NMOS) transistors and a current mirror circuit composed of a current source and two P-channel MOS (PMOS) transistors, as in the suppresser of FIG. 4 which is the first embodiment of the invention. Each of the current-limiting element 5 and 5' is a current mirror circuit that comprises two P-channel MOS (PMOS) transistors. As seen from FIG. 7, the suppresser has some components that are not provided in the suppresser of FIG. 4. These components will be described below, while the other components identical to those shown in FIG. 4 will not be described.

As shown in FIG. 7, the voltage-to-current converting circuit 4' comprises a third differential circuit, a third current source I2' and a fourth current mirror circuit. The third differential circuit is composed of two N-channel MOS (NMOS) transistors M11 and M12. The fourth current mirror circuit is composed of two P-channel MOS (PMOS) transistors M13 and M14. The gate of the NMOS transistor M11 provided in the third differential circuit is connected to the input terminal 6' of bias potential Vb'. The gate of the NMOS transistor M12 is connected to the input terminal 1. The third current source I2' provided in the third differential circuit is connected at one end to the sources of the NMOS transistors M11 and M12 and at the other end to the ground potential Vss. The gate and drain of the PMOS transistor M13 provided in the fourth current mirror circuit are connected to the drain of the NMOS transistor M11. The source of the PMOS transistor M13 is connected to the power-supply potential Vcc. The gate of the NMOS transistor M11, the gate of the NMOS transistor M12, and the drain of the NMOS transistor M12 serve as the non-inverting input terminal (+), inverting input terminal (−) and output terminal of the voltage-to-current converting circuit 4', respectively.

The current-limiting element 5' of the suppresser shown in FIG. 7 is a fifth current mirror circuit that comprises two P-channel MOS (PMOS) transistors M15 and M16. The gate and drain of the PMOS transistor M15 provided in the fifth current mirror circuit are connected to the drain of the PMOS transistor M14. The source of the PMOS transistor M15 is connected to the power-supply potential Vcc. The PMOS transistor M16 has its gate connected to the gate of the PMOS transistor M15, its drain connected to the drain of the MPOS transistor M3, and its source connected to the power-supply potential Vcc.

The gain of the suppresser shown in FIG. 7 sharply changes when the level Vin of the input signal is Vb and when the level Vin is Vb', as is illustrated in FIG. 6. The gain of this suppresser is given as follows:

$$Vout/Vin = 1 - n \cdot gm2/gm1 - n' \cdot gm2'/gm1$$

where n' is the mirror ratio of the fifth current mirror circuit that comprises the PMOS transistors M15 and M16.

The k constant of the NMOS transistors constituting the differential circuit in each of the voltage-to-current converting circuits 3, 4 and 4', the current supplied from the current source in each voltage-to-current converting circuit, and the mirror ratio of each current mirror circuit, i.e., each of the current-limiting elements 5 and 5' are controlled, thereby adjusting the suppression level r (=(n·gm2+n'·gm2')/gm1) to a level less than 1.

In the suppresser shown in FIG. 7, both current-limiting elements 5 and 5' are current mirror circuits. Nonetheless, the current-limiting elements 5 and 5' may be replaced by a PN-junction diode as is illustrated in FIG. 3. If necessary, the circuit composed of the voltage-to-current converting circuit 4 and current-limiting element 5 and the circuit composed of the voltage-to-current converting circuit 4' and current-limiting element 5', which are connected in parallel to each other, may be replaced by three or more circuits, which are connected in parallel to each other, each composed of a similar voltage-to-current converting circuit and a similar current-limiting element. In this case, different bias potentials are applied to the non-inverting input terminals of the voltage-to-current converting circuits of these circuits.

Figure 8:
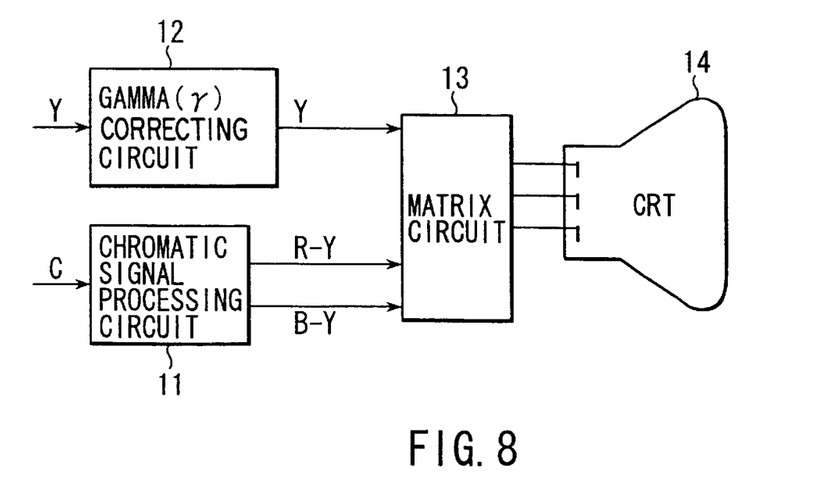
FIG. 8 is a block diagram showing the major section of a television receiver that incorporates a suppresser according to the present invention.

The suppressors according to the invention, described above, are particularly fit for use in correcting video signals to accomplish gamma correction in television receivers. FIG. 8 is a block diagram showing the major section of a television receiver that incorporates a suppresser according to the present invention.

As shown in FIG. 8, a signal processing circuit (not shown) generates a chromatic signal C and a luminance signal Y. The chromatic signal is input to a chromatic signal processing circuit 11, which generates color-difference signals R-Y and B-Y. Meanwhile, the luminance signal is input to a gamma correcting circuit 12, which suppresses the white-level component of the luminance signal Y. The color-difference signals R-Y and B-Y and the luminance signal Y with its white-level component suppressed are input to a matrix circuit 13. The matrix circuit 13 composes the input signals, thereby generating three drive voltages that represent three primary colors, i.e., red (R), green (G) and blue (B), respectively. The drive signals are input to a CRT 14.

In the television receiver of FIG. 8, the gamma correcting circuit 12 suppresses the white-level component of the luminance signal Y. This makes it possible to compensate for the error that results from the exponential input-output characteristic of the television receiver. A beam current having almost linear relation with the video signal input to the television receiver is therefore generated in the CRT 14. Hence, the CRT 14 can display images of high quality.

The suppressors according to the invention can be used in various signal processing other than the correcting of video signals to accomplish gamma correction in television receivers. The suppresser of this invention is not limited to the first and second embodiments described above. Various changes and modifications can be made without departing form the scope and spirit of the invention.

As has been described in detail, the present invention can provide a suppresser which comprises MOS transistors and which can yet exhibit stable operating characteristics, despite the fact that the output impedance of each MOS transistor differs from the design value due to errors in the manufacturing process and changes as the temperature of the transistor varies.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A suppresser circuit comprising:

a first voltage-to-current converting circuit configured to convert an input voltage signal to an output current signal;

a second voltage-to-current converting circuit having a non-inverting input terminal for receiving a predetermined bias potential and an inverting input terminal for receiving the input voltage signal; and a current-limiting element connected between the first and second voltage-to-current converting circuits, configured to substantially stop a flow of current between the first and second voltage-to-current converting circuits while the input voltage signal remains at a level equal to or lower than the bias potential, and decrease the output current signal of the first voltage-to-current converting circuit while the input voltage signal remains at a level higher than the bias potential.

2. The suppresser circuit according to claim 1, wherein the first voltage-to-current converting circuit has a non-inverting input terminal and an inverting input terminal, the input voltage signal is supplied to the non-inverting input terminal of the first voltage-to-current converting circuit, and the inverting input terminal of the first voltage-to-current converting circuit is connected to an output terminal.

3. The suppresser circuit according to claim 1, wherein the current-limiting element comprises a PN-junction diode connected between the first and second voltage-to-current converting circuits.

4. The suppresser circuit according to claim 1, wherein the second voltage-to-current converting circuit has transconductance smaller than that of the first voltage-to-current converting circuit.

5. The suppresser circuit according to claim 1, which further comprises at least one additional voltage-to-current converting circuit having a non-inverting input terminal and an inverting input terminal and at least one additional current-limiting element, and in which a pair of the second voltage-to-current converting circuit and the current-limiting element, and a pair of the additional voltage-to-current converting circuit and the additional current-limiting element are connected in parallel to the first voltage-to-current converting circuit, and different bias potentials are applied to the non-inverting input terminals of the second voltage-to-current converting circuit and the additional voltage-to-current converting circuit.

6. A suppresser circuit comprising:

an input terminal;

an output terminal;

a first potential-applied node;

a second potential-applied node;

a first differential circuit composed of first and second MOS transistors of a first conductivity type, said first MOS transistor having a gate connected to the input terminal, a source and a drain, and said second MOS transistor having a gate and a drain, both connected to the output terminal, and a source;

a first current source connected at one end to the sources of the first and second MOS transistors and at the other end to the first potential-applied node;

a first current mirror circuit composed of third and fourth MOS transistors of a second conductivity type, said third MOS transistor having a gate and a drain, both connected to the drain of the first MOS transistor, and a source connected to the second potential-applied node, and said fourth MOS transistor having a gate connected to the gate of the third MOS transistor, a drain connected to the drain of the second MOS transistor and a source connected to the second potential-applied node;

a second differential circuit composed of fifth and sixth MOS transistors of the first conductivity type, said fifth MOS transistor having a source, a drain and a gate for receiving a predetermined bias potential, and said sixth MOS transistor having a source, a drain and a gate connected to the input terminal;

a second current source connected at one end to the sources of the fifth and sixth MOS transistors and at the other end to the first potential-applied node;

a second current mirror circuit composed of seventh and eighth MOS transistors of the second conductivity type, said seventh MOS transistor having a gate and a drain, both connected to the drain of the fifth MOS transistor, and a source connected to the second potential-applied node, and said eighth MOS transistor having a gate connected to the gate of the seventh MOS transistor, a drain connected to the drain of the sixth MOS transistor and a source connected to the second potential-applied node; and a third current mirror circuit composed of ninth and tenth MOS transistors of the second conductivity type, said ninth MOS transistor having a gate and a drain, both connected to the drain of the eighth MOS transistor, and a source connected to the second potential-applied node, and said tenth MOS transistor having a gate connected to the gate of the ninth MOS transistor, a drain connected to the drain of the third MOS transistor and a source connected to the second potential-applied node.

7. The suppresser circuit according to claim 6, wherein the first and second MOS transistors have a channel width-to-length ratio W/L, and the fifth and sixth MOS transistors have a channel width-to-length ratio W/L different from that of the first and second MOS transistors.

8. The suppresser circuit according to claim 6, wherein the first and second current sources supply currents of different values.

9. The suppresser circuit according to claim 6, wherein the ninth and tenth MOS transistors have different channel width-to-length ratios W/L.

10. The suppresser circuit according to claim 6, further comprising:

a third differential circuit composed of eleventh and twelfth MOS transistors of the first conductivity type, said eleventh MOS transistor having a source, a drain and a gate for receiving a bias potential different from the bias potential applied to the gate of the fifth MOS transistor, and said twelfth MOS transistor having a source, a drain and a gate connected to the input terminal;

a third current source connected at one end to the sources of the eleventh and twelfth MOS transistors, and at the other end to the first potential-applied node;

a fourth current mirror circuit composed of thirteenth and fourteenth MOS transistors of the second conductivity type, said thirteenth MOS transistor having a gate and a drain, both connected to the drain of the eleventh MOS transistor, and a source connected to the second potential-applied node, and said fourteenth MOS transistor having a gate connected to the gate of the thirteenth MOS transistor, a drain connected to the drain of the twelfth MOS transistor and a source connected to the second potential-applied node; and a fifth current mirror circuit composed of fifteenth and sixteenth MOS transistors of the second conductivity type, said fifteenth MOS transistor having a gate and a drain, both connected to the drain of the fourteenth MOS transistor, and a source connected to the second potential-applied node, and said sixteenth MOS transistor having a gate connected to the gate of the fifteenth MOS transistor, a drain connected to the drain of the third MOS transistor and a source connected to the second potential-applied node.

11. A video signal processing circuit comprising:

a first signal processing circuit configured to receive a chromatic signal of a video signal, and process the chromatic signal to generate a color-difference signal;

a second signal processing circuit configured to receive a luminance signal of the video signal, and process the luminance signal to suppress a white-level component thereof; and a matrix circuit configured to receive output signals of the first and second signal processing circuits, and combine the output signals, said second signal processing circuit including:

a first voltage-to-current converting circuit configured to convert an input voltage signal to an output current signal;

a second voltage-to-current converting circuit having a non-inverting input terminal for receiving a predetermined bias potential and an inverting input terminal for receiving the input voltage signal; and a current-limiting element connected between the first and second voltage-to-current converting circuits, configured to substantially stop a flow of current between the first and second voltage-to-current converting circuits while the input voltage signal remains at a level equal to or lower than the predetermined bias potential, and decrease the output current signal of the first voltage-to-current converting circuit while the input voltage signal remains at a level higher than the predetermined bias potential.

12. The suppresser circuit according to claim 11, wherein the first voltage-to-current converting circuit has a non-inverting input terminal and an inverting input terminal, the input voltage signal is supplied to the non-inverting input terminal of the first voltage-to-current converting circuit, and the inverting input terminal of the first voltage-to-current converting circuit is connected to an output terminal.

13. The suppresser circuit according to claim 11, wherein the current-limiting element comprises a PN-junction diode connected between the first and second voltage-to-current converting circuits.

14. The suppresser circuit according to claim 11, wherein the second voltage-to-current converting circuit has transconductance smaller than that of the first voltage-to-current converting circuit.

15. The suppresser circuit according to claim 11, which further comprises at least one additional voltage-to-current converting circuit having a non-inverting input terminal and an inverting input terminal and at least one additional current-limiting element, and in which a pair of the second voltage-to-current converting circuit and the current-limiting element, and a pair of the additional voltage-to-current converting circuit and the additional current-limiting element are connected in parallel to the first voltage-to-current converting circuit, and different bias potentials are applied to the non-inverting input terminals of the second voltage-to-current converting circuit and the additional voltage-to-current converting circuit.

16. The suppresser circuit according to claim 11, wherein the first voltage-to-current converting circuit includes:

a first differential circuit composed of first and second MOS transistors of a first conductivity type, said first MOS transistor having a gate connected to an input terminal, a source and a drain, and said second MOS transistor having a gate and a drain, both connected to an output terminal, and a source;

a first current source connected at one end to the sources of the first and second MOS transistors and at the other end to a first potential-applied node; and a first current mirror circuit composed of third and fourth MOS transistors of a second conductivity type, said third MOS transistor having a gate and a drain, both connected to the drain of the first MOS transistor, and a source connected to a second potential-applied node, and said fourth MOS transistor having a gate connected to the gate of the third MOS transistor, a drain connected to the drain of the second MOS transistor and a source connected to the second potential-applied node, the second voltage-to-current converting circuit includes:

a second differential circuit composed of fifth and sixth MOS transistors of the first conductivity type, said fifth MOS transistor having a source, a drain and a gate for receiving a predetermined bias potential, and said sixth MOS transistor having a source, a drain and a gate connected to the input terminal;

a second current source connected at one end to the sources of the fifth and sixth MOS transistors and at the other end to the first potential-applied node; and a second current mirror circuit composed of seventh and eighth MOS transistors of the second conductivity type, said seventh MOS transistor having a gate and a drain, both connected to the drain of the fifth MOS transistor, and a source connected to the second potential-applied node, and said eighth MOS transistor having a gate connected to the gate of the seventh MOS transistor, a drain connected to the drain of the sixth MOS transistor and a source connected to the second potential-applied node, and the current-limiting element includes:

a third current mirror circuit composed of ninth and tenth MOS transistors of the second conductivity type, said ninth MOS transistor having a gate and a drain, both connected to the drain of the eighth MOS transistor, and a source connected to the second potential-applied node, and said tenth MOS transistor having a gate connected to the gate of the ninth MOS transistor, a drain connected to the drain of the third MOS transistor and a source connected to the second potential-applied node.

17. The suppresser circuit according to claim 16, wherein the first and second MOS transistors have a channel width-to-length ratio W/L, and the fifth and sixth MOS transistors have a channel width-to-length ratio W/L different from that of the first and second MOS transistors.

18. The suppresser circuit according to claim 16, wherein the first and second current sources supply currents of different values.

19. The suppresser circuit according to claim 16, wherein the ninth and tenth MOS transistors have different channel width-to-length ratios W/L.

20. The suppresser circuit according to claim 16, further comprising:

a third differential circuit composed of eleventh and twelfth MOS transistors of the first conductivity type, said eleventh MOS transistor having a source, a drain and a gate for receiving a bias potential different from the bias potential applied to the gate of the fifth MOS transistor, and said twelfth MOS transistor having a source, a drain and a gate connected to the input terminal;

a third current source connected at one end to the sources of the eleventh and twelfth MOS transistors, and at the other end to the first potential-applied node;

a fourth current mirror circuit composed of thirteenth and fourteenth MOS transistors of the second conductivity type, said thirteenth MOS transistor having a gate and a drain, both connected to the drain of the eleventh MOS transistor, and a source connected to the second potential-applied node, and said fourteenth MOS transistor having a gate connected to the gate of the thirteenth MOS transistor, a drain connected to the drain of the twelfth MOS transistor and a source connected to the second potential-applied node; and a fifth current mirror circuit composed of fifteenth and sixteenth MOS transistors of the second conductivity type, said fifteenth MOS transistor having a gate and a drain, both connected to the drain of the fourteenth MOS transistor, and a source connected to the second potential-applied node, and said sixteenth MOS transistor having a gate connected to the gate of the fifteenth MOS transistor, a drain connected to the drain of the third MOS transistor and a source connected to the second potential-applied node.

* * * * *